United States Patent
Lee

(10) Patent No.: US 7,688,151 B2
(45) Date of Patent: Mar. 30, 2010

(54) AGING COMPENSATION METHOD AND CONTROL MODULE FOR AN OSCILLATOR CIRCUIT DEVICE

(75) Inventor: Tung-Teh Lee, Taipei (TW)

(73) Assignee: Taitien Electronics Co., Ltd., Taipei (TW)

( * ) Notice: Subject to any disclaimer, the term of this patent is extended or adjusted under 35 U.S.C. 154(b) by 37 days.

(21) Appl. No.: 12/121,081

(22) Filed: May 15, 2008

(65) Prior Publication Data

US 2009/0184772 A1    Jul. 23, 2009

(30) Foreign Application Priority Data

Jan. 21, 2008    (TW) ............................... 97102170 A

(51) Int. Cl.
*G01R 23/00* (2006.01)
*H03B 5/32* (2006.01)
*H03B 5/36* (2006.01)
*H03L 7/085* (2006.01)

(52) U.S. Cl. ............................ 331/44; 331/17; 331/158

(58) Field of Classification Search ............. 331/16–18, 331/25, 44, 116 R, 116 FE, 158, 159, 177 R, 331/177 V
See application file for complete search history.

(56) References Cited

U.S. PATENT DOCUMENTS 4,677,394 A * 6/1987 Vollmer ....................... 331/1 A

* cited by examiner

*Primary Examiner*—David Mis
(74) *Attorney, Agent, or Firm*—McNees Wallace & Nurick, LLC

(57) ABSTRACT

An aging compensation method for an oscillator circuit device, in which the oscillator circuit device receives a control voltage from an application end, and outputs a clock signal with a predetermined frequency in response to the control voltage, includes the steps of: a) inspecting the control voltage from the application end to obtain a first value thereof; b) after a predetermined time period has elapsed, inspecting the control voltage from the application end to obtain a second value thereof; c) determining whether there is a difference between the first and second values of the control voltage; d) if it is determined that there is a difference, performing compensation on the value of the control voltage based on the difference; and e) repeating steps b) through d).

8 Claims, 4 Drawing Sheets

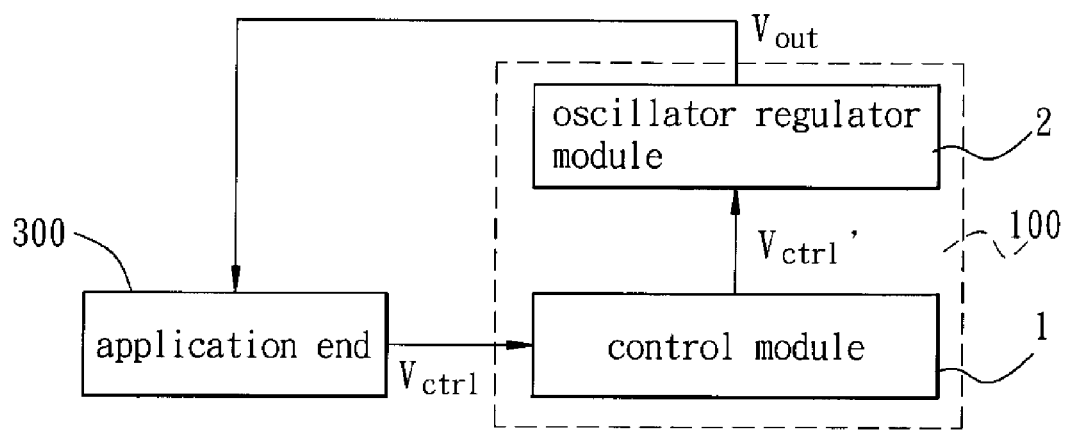
F I G. 1

AGING COMPENSATION METHOD AND CONTROL MODULE FOR AN OSCILLATOR CIRCUIT DEVICE

CROSS-REFERENCE TO RELATED APPLICATION

This application claims priority of Taiwanese application no. 097102170, filed on Jan. 21, 2008.

BACKGROUND OF THE INVENTION

1. Field of the Invention

This invention relates to a clock signal compensation method and a device for producing the clock signal, more particularly to an aging compensation method and control module for an oscillator circuit device.

2. Description of the Related Art

In the field of crystal oscillator technology, accuracy of a crystal oscillator is defined by maintenance of a consistent clock frequency over a period of time or within a certain temperature range, and is typically measured in parts per million (PPM). Systems employing the most accurate quartz crystal, or using locking technology of a voltage controlled crystal oscillator (VCXO), are capable of providing high accuracy. Nonetheless, over a period of use, vibration frequency of the voltage controlled crystal oscillator is prone to diminished accuracy resulting from crystal oscillator aging, a phenomena in which the crystal itself undergoes change over time.

SUMMARY OF THE INVENTION

Therefore, an object of the present invention is to provide an aging compensation method and control module for an oscillator circuit device that are capable of overcoming the aforementioned drawbacks of the prior art.

According to one aspect of the present invention, there is provided an aging compensation method for an oscillator circuit device. The oscillator circuit device receives a control voltage from an application end and outputs a clock signal with a predetermined frequency in response to the control voltage. The aging compensation method comprises the steps of:

a) inspecting the control voltage from the application end to obtain a first value thereof;

b) after a predetermined time period has elapsed, inspecting the control voltage from the application end to obtain a second value thereof;

c) determining whether there is a difference between the first and second values of the control voltage;

d) if it is determined that there is a difference, performing compensation on the value of the control voltage based on the difference; and e) repeating steps b) through d).

According to another aspect of the present invention, there is provided an oscillator circuit device that receives a control voltage from an application end and that outputs a clock signal with a predetermined frequency in response to the control voltage. The oscillator circuit device comprises a control module and an oscillator regulator module.

The control module is for determining whether there is a variance in value of the control voltage over a predetermined time period, and for performing compensation on the value of the control voltage based on the variance determined thereby.

The oscillator regulator module receives from the control module the control voltage with an uncompensated value when the control module determines that there is no variance in the value of the control voltage over the predetermined time period and the control voltage with a compensated value when otherwise, and controls output of the clock signal in accordance with the control voltage received from the control module.

According to yet another aspect of the present invention, there is provided a control module for an oscillator circuit device. The control module is adapted to receive a control voltage from an application end and to output a clock signal with a predetermined frequency in response to the control voltage. The control module comprises a processing unit, a timer, a receiving unit, and a memory unit.

The timer is for counting a predetermined time period and for notifying the processing unit at the end of the predetermined time period.

The receiving unit receives a first value of the control voltage from the application end, and after the predetermined time period has elapsed, a second value of the control voltage from the application end, and provides the first value and the second value to the processing unit.

The memory unit is for recording the first value and second value.

The processing unit determines whether there is a difference between the first and second values, and performs compensation on the value of the control voltage based on the difference determined thereby.

BRIEF DESCRIPTION OF THE DRAWINGS

Other features and advantages of the present invention will become apparent in the following detailed description of the preferred embodiment with reference to the accompanying drawings, of which:

FIG. 1 is a schematic block diagram of a preferred embodiment of an oscillator circuit device according to the present invention;

DETAILED DESCRIPTION OF THE PREFERRED EMBODIMENT

Referring to FIG. 1, the preferred embodiment of an oscillator circuit device 100 according to the present invention is shown to receive a control voltage ($V_{ctrl}$) from an application end 300 and to output a clock signal ($V_{out}$) with a predetermined frequency in response to the control voltage ($V_{ctrl}$). The oscillator circuit device 100 comprises a control module 1 and an oscillator regulator module 2. In this embodiment, the oscillator circuit device 100 is a voltage-controlled crystal oscillator (VXCO). However, the invention could be another device employing the same technical principles, such as a temperature-controlled crystal oscillator (TXCO) or an oven-controlled oscillator circuit device (OXCO).

Figure 2:
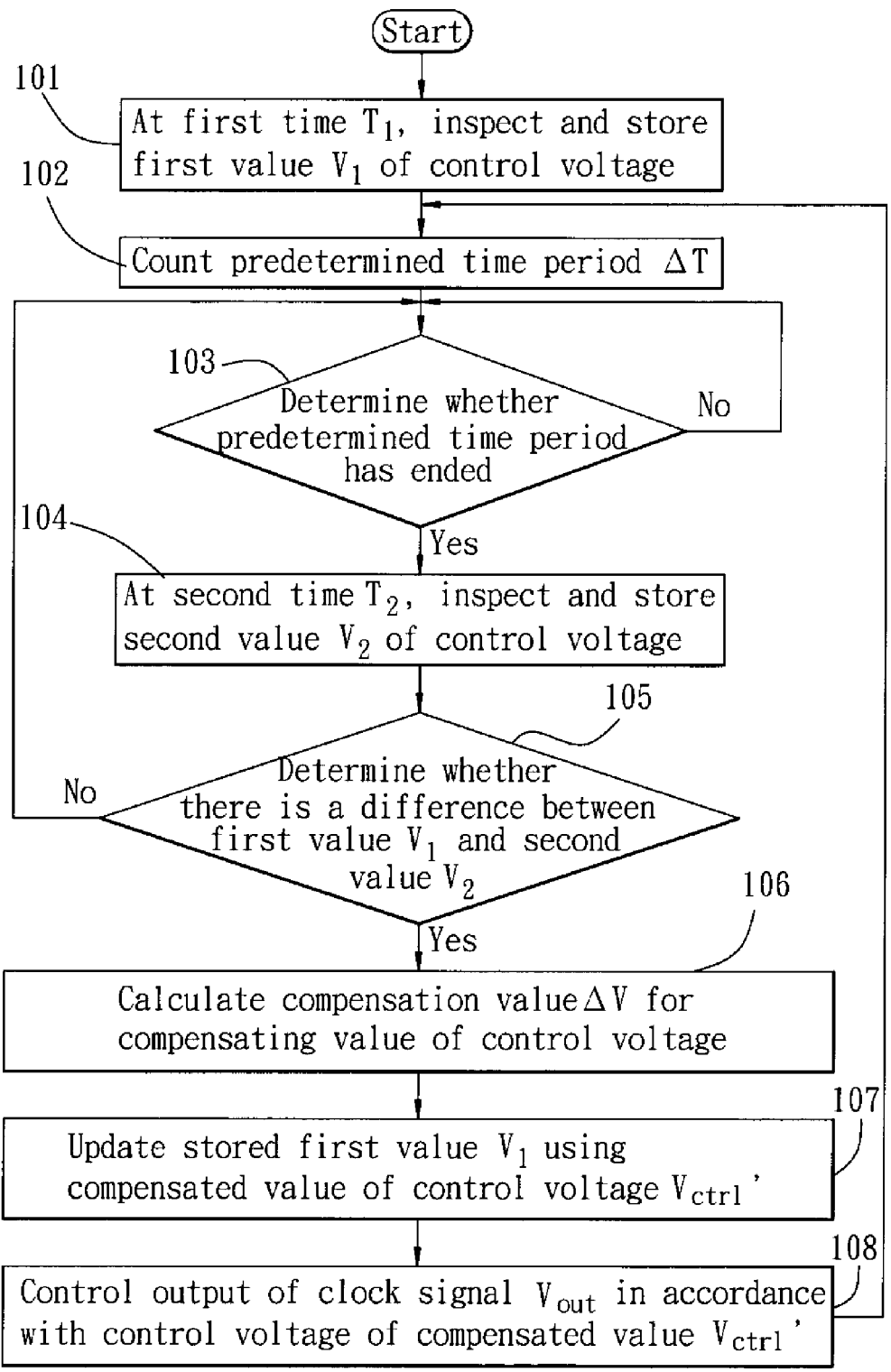
FIG. 2 is a flow chart of a preferred embodiment of an aging compensation method for an oscillator circuit device according to the present invention.
Figure 3:
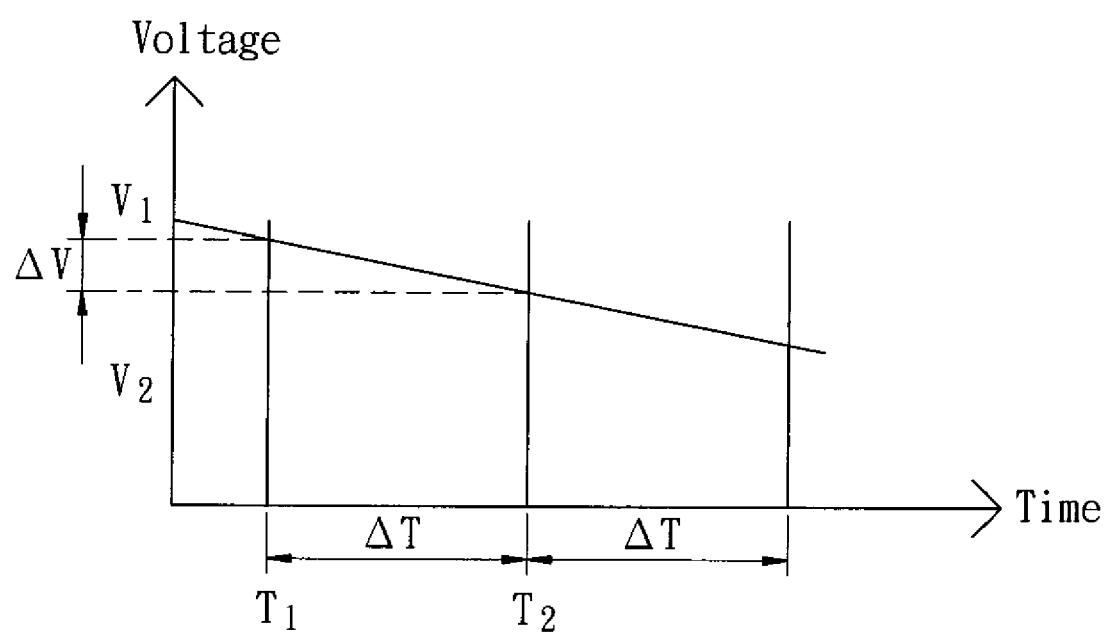
FIG. 3 is a voltage vs. time plot showing first and second values of a control voltage obtained at different times according to the preferred embodiment of an aging compensation method.

Referring to FIG. 2 and at the same time to FIGS. 1 and 3, a preferred embodiment of an aging compensation method for an oscillator circuit device 100 according to the present invention includes the following steps:

In step 101, at a first time ($T_1$), through the control module 1 of the oscillator circuit device 100, the control voltage ($V_{ctrl}$) from the application end 300 is inspected to obtain and store a first value ($V_1$) thereof. The flow then proceeds to step 102.

In step 102, through the control module 1, a predetermined time period ($\Delta T$) is counted. The flow then proceeds to step 103.

In step 103, through the control module 1, it is determined whether the predetermined time period ($\Delta T$) has ended. If it is determined to have ended, the flow proceeds to step 104. Otherwise, the flow returns to step 103.

In step 104, at a second time ($T_2$), through the control module 1, the control voltage ($V_{ctrl}$) from the application end 300 is inspected to obtain and store a second value ($V_2$) thereof. The flow then proceeds to step 105.

In step 105, through the control module 1, it is determined whether there is a difference between the first and second values ($V_1$, $V_2$) of the control voltage ($V_{ctrl}$). If it is determined that there is a difference, the flow proceeds to step 106. Otherwise, the flow returns to step 103.

In step 106, through the control module 1, a compensation value ($\Delta V$) is calculated based on the difference, and is used for performing compensation on the value of the control voltage ($V_{ctrl}$). The flow then proceeds to step 107.

In step 107, through the control module 1, a compensated value of the control voltage ($V_{ctrl}'$) is used to update the stored first value ($V_1$) of the control voltage ($V_{ctrl}$). The flow then proceeds to step 108.

In step 108, through the oscillator regulator module 2, the output of the clock signal ($V_{out}$) is controlled in accordance with the compensated value of the control voltage ($V_{ctrl}'$). The flow then returns to step 102.

In this embodiment of an aging compensation method for an oscillator circuit device 100, at the end of the predetermined time period ($\Delta T$), it is automatically determined through the control module 1 whether there is a difference between the first and second values ($V_1$, $V_2$) of the control voltage ($V_{ctrl}$), and compensation is automatically performed through the control module 1 on the value of the control voltage ($V_{ctrl}$) based on the difference determined thereby. Since the oscillator circuit device 100 of the preferred embodiment is capable of performing compensation on the value of the control voltage ($V_{ctrl}$), and therefore capable of compensating for effects of crystal oscillator aging, the application end 300 does not need to alter the control voltage supplied to the oscillator circuit device 100.

Figure 4:
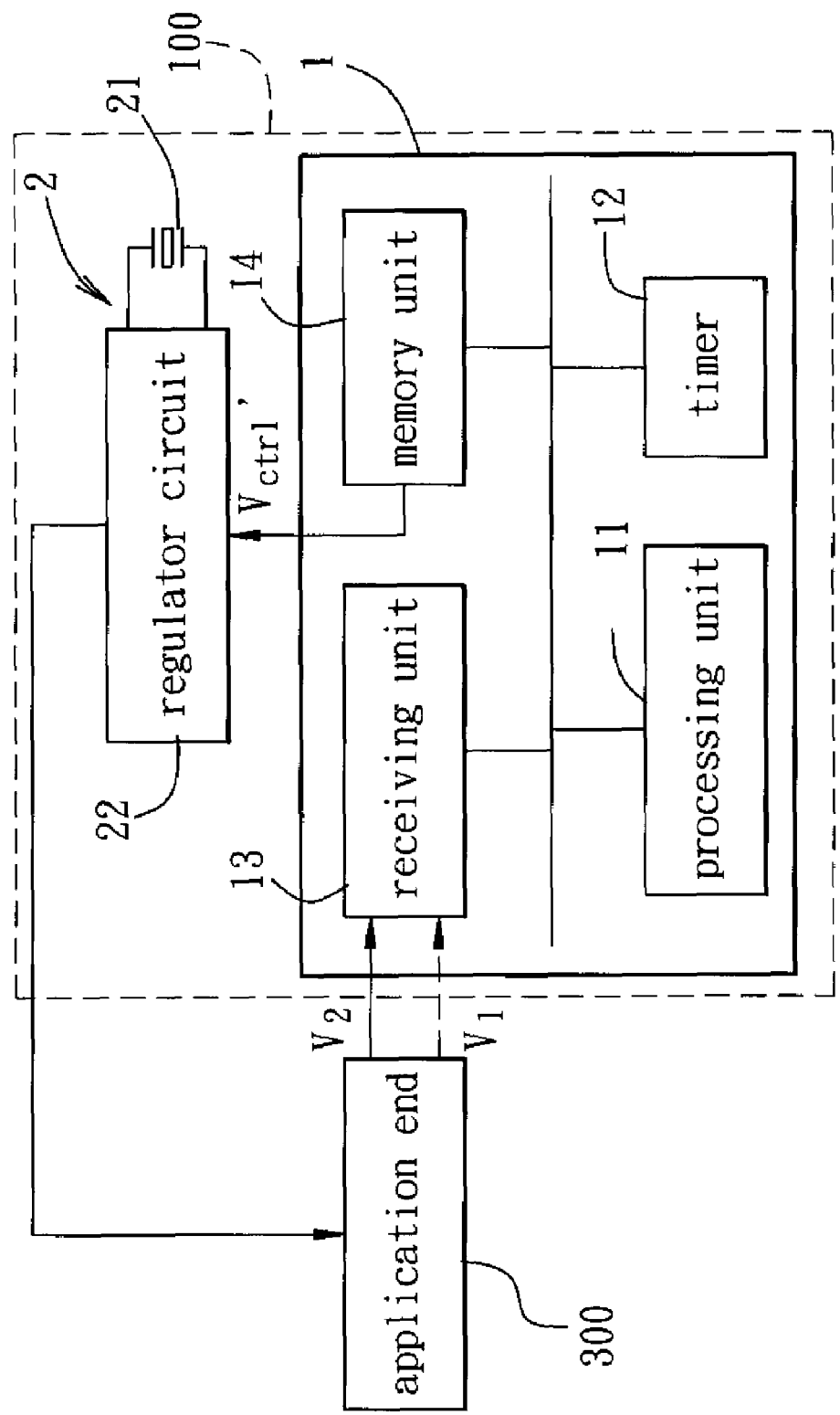
FIG. 4 is a schematic circuit block diagram of a control module of the preferred embodiment of an oscillator circuit device.

Referring to FIG. 4, a control module 1 of the preferred embodiment is shown to comprise a processing unit 11, a timer 12, a receiving unit 13 and a memory unit 14. The oscillator regulator module 2 is provided with a crystal element 21 and a regulator circuit 22 controlled to regulate a resonance frequency of the crystal element 21.

The processing unit 11 is used to control and coordinate operations of the various components of the control module 1. The timer 12 is used to count a predetermined time period and to notify the processing unit 11 when the predetermined time period has elapsed. The receiving unit 13 is controlled by the processing unit 11, receives a first value ($V_1$) of the control voltage from the application end 300, and after the predetermined time period has elapsed, a second value ($V_2$) of the control voltage, and provides the processing unit 11 with the first and second values ($V_1$, $V_2$). In this embodiment, the receiving unit 13 includes an analog-to-digital converter unit, which converts the first and second values ($V_1$, $V_2$) of the control voltage into digital data to be provided to the processing unit 11. The memory unit 14 records the digital data of the first and second values ($V_1$, $V_2$).

The processing unit 11 determines whether there is a difference between the first and second values ($V_1$, $V_2$) and, having determined that there is a difference, calculates a compensation value ($\Delta V$) based on the difference. Compensation is then performed on the value of the control voltage based on the compensation value ($\Delta V$). The compensated value of the control voltage ($V_{ctrl}'$) is then recorded in the memory unit 14. The control module 1 then outputs the control voltage with the compensated value ($V_{ctrl}'$) to the regulator circuit 22 for regulating the frequency of the crystal element 21. At the end of the predetermined time period ($\Delta T$), the processing unit 11 automatically determines whether there is a difference between the first and second values ($V_1$, $V_2$) of the control voltage and automatically performs compensation on the value of the control voltage based on the difference determined thereby.

In sum, the oscillator circuit device 100 of the present invention, performing the aging compensation method of the present invention, automatically determines whether there is a variance in the value of the control voltage received from the application end 300 over a predetermined time period ($\Delta T$), and automatically performs compensation on the value of the control voltage based on the variance determined thereby, thereby correcting for effects of the aging phenomenon to achieve high accuracy.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An aging compensation method for an oscillator circuit device, the oscillator circuit device receiving a control voltage from an application end and outputting a clock signal with a predetermined frequency in response to the control voltage, said aging compensation method comprising the steps of:
    a) inspecting the control voltage from the application end to obtain a first value thereof;
    b) after a predetermined time period has elapsed, inspecting the control voltage from the application end to obtain a second value thereof;
    c) determining whether there is a difference between the first and second values of the control voltage;
    d) if it is determined that there is a difference, performing compensation on a third value of the control voltage based on the difference; and
    e) repeating steps b) through d).

2. The aging compensation method for an oscillator circuit device as claimed in claim 1, wherein the first value of the control voltage is stored in step a); and a compensated value of the control voltage is used to update the stored value of the control voltage in step d).

3. A control module for an oscillator circuit device, said control module being adapted to receive a control voltage from an application end, said control module comprising:
    a processing unit;
    a timer for counting a predetermined time period and for notifying said processing unit at the end of the predetermined time period;
    a receiving unit for receiving a first value of the control voltage from the application end, and after the predetermined time period has elapsed, a second value of the control voltage from the application end, and for providing the first value and the second value to the processing unit; and a memory unit for recording the first value and the second value;

said processing unit determining whether there is a difference between the first value and the second value, and performing compensation on a third value of the control voltage based on the difference determined thereby.

4. The control module for an oscillator circuit device as claimed in claim 3, wherein said processing unit uses a compensated value of the control voltage to update the first value of the control voltage stored in said memory unit.

5. An oscillator circuit device adapted for receiving a control voltage from an application end and for outputting a clock signal with a predetermined frequency in response to the control voltage, said oscillator circuit device comprising:

a control module for determining whether there is a difference between a first value and a second value of the control voltage over a predetermined time period, and for performing compensation on a third value of the control voltage based on the difference between the first value and the second value determined thereby; and an oscillator regulator module, that receives from said control module the control voltage with an uncompensated value when said control module determines that there is no difference between the first value and the second value of the control voltage over the predetermined time period and the control voltage with a compensated value when otherwise, and that controls output of the clock signal in accordance with the control voltage received from said control module.

6. The oscillator circuit device of claim 5, wherein said control module includes:

a processing unit;

a timer for counting the predetermined time period and for notifying said processing unit at the end of the predetermined time period;

a receiving unit for receiving a first value of the control voltage from the application end, and after the predetermined time period has elapsed, a second value of the control voltage from the application end, and for providing the first value and the second value to said processing unit; and a memory unit for recording the first value and the second value;

said processing unit determining whether there is a difference between the first value and the second value of the control voltage, and performing compensation on a third value of the control voltage based on the difference determined thereby.

7. The oscillator circuit device as claimed in claim 6, wherein said receiving unit includes an analog-to-digital converter unit that converts the first value and the second value into digital data, and that provides the digital data to said processing unit.

8. The oscillator circuit device as claimed in claim 5, wherein said oscillator circuit device is one of a voltage-controlled crystal oscillator (VCXO), a temperature-controlled crystal oscillator (TCXO) and an oven-controlled crystal oscillator (OCXO).

* * * * *